(12) United States Patent
Quinton et al.

(10) Patent No.: US 7,265,567 B2
(45) Date of Patent: Sep. 4, 2007

(54) FIRST DIE INDICATOR FOR INTEGRATED CIRCUIT WAFER

(75) Inventors: Jeffrey C. Quinton, Rossville, IN (US); Timothy A. Allison, Kokomo, IN (US); Daniel L. Schnabel, Kokomo, IN (US); Brad J. Silvers, Kokomo, IN (US); Joseph C. Ney, Greentown, IN (US); Robert J. Grossman, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 43 days.

(21) Appl. No.: 11/141,338

(22) Filed: May 31, 2005

(65) Prior Publication Data

US 2006/0267617 A1    Nov. 30, 2006

(51) Int. Cl.
*G01R 31/02* (2006.01)
(52) U.S. Cl. ...................................... 324/763
(58) Field of Classification Search ............... None
See application file for complete search history.

(56) References Cited

U.S. PATENT DOCUMENTS

| | | | |
|---|---|---|---|
| 5,787,174 A * | 7/1998 | Tuttle | 324/764 |
| 6,161,213 A * | 12/2000 | Lofstrom | 324/764 |
| 6,701,259 B2 * | 3/2004 | Dor et al. | 702/35 |
| 6,717,430 B2 * | 4/2004 | Burch | 324/765 |
| 6,792,359 B2 * | 9/2004 | Ninomiya et al. | 702/35 |
| 6,812,477 B2 * | 11/2004 | Matsunami | 250/548 |
| 6,928,375 B2 * | 8/2005 | Ono et al. | 702/81 |
| 7,010,447 B2 * | 3/2006 | Ninomiya et al. | 702/84 |
| 7,119,351 B2 * | 10/2006 | Woelki | 250/559.4 |
| 2002/0035435 A1 * | 3/2002 | Ninomiya et al. | 702/35 |
| 2003/0202182 A1 * | 10/2003 | Matsumoto et al. | 356/401 |
| 2005/0042780 A1 * | 2/2005 | Matsunami | 438/14 |
| 2005/0195396 A1 * | 9/2005 | Ono et al. | 356/394 |
| 2007/0031993 A1 * | 2/2007 | Nemets et al. | 438/110 |

* cited by examiner

Primary Examiner—Jermele Hollington
(74) Attorney, Agent, or Firm—Jimmy L. Funke

(57) ABSTRACT

An integrated circuit (IC) wafer includes a plurality of die and a first die indicator (FDI) formed on the wafer in a metal layer. The plurality of die include a first potentially good die and the FDI, which is detectable by a machine vision recognition system, provides a unique indication of the first potentially good die.

14 Claims, 6 Drawing Sheets

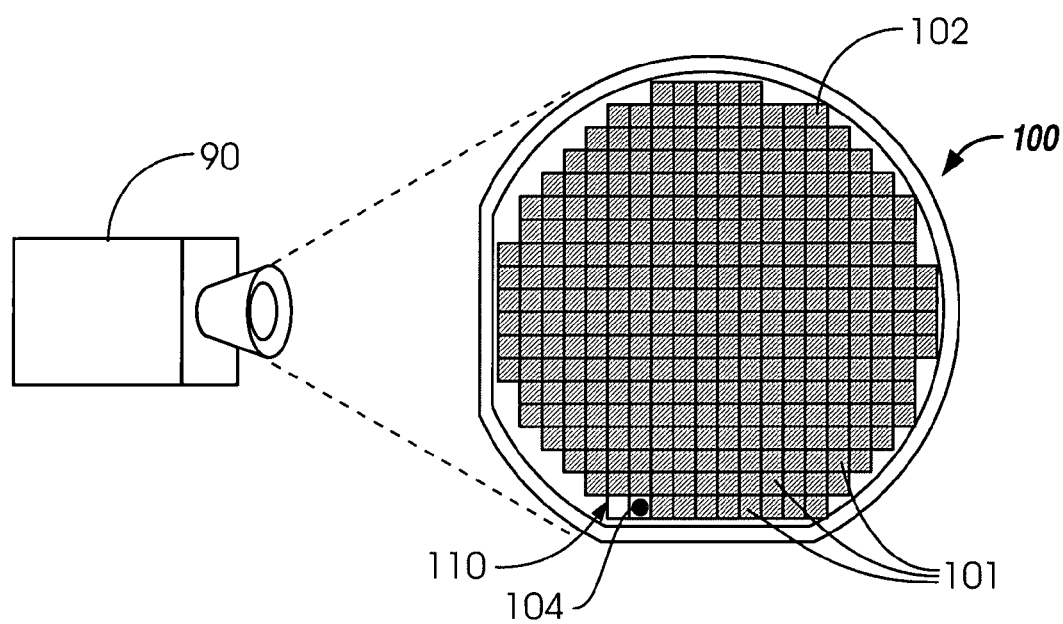
FIG. 1
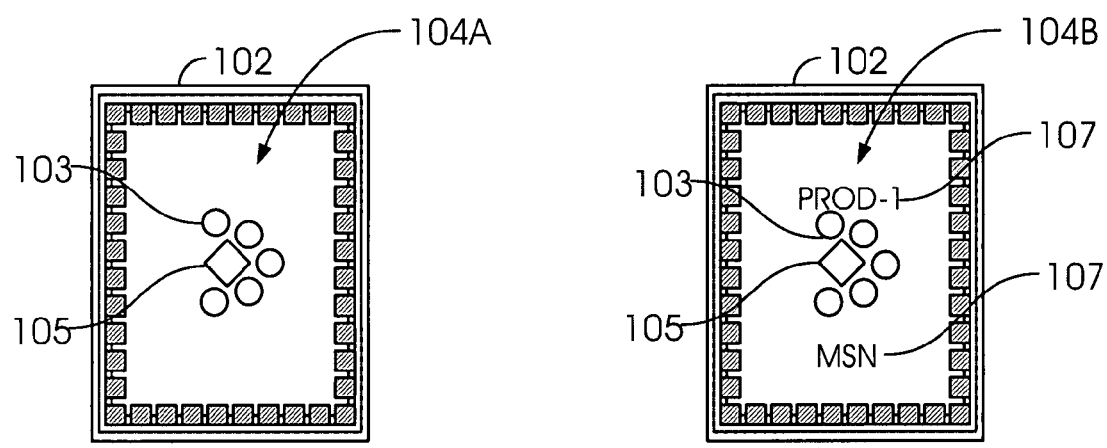
FIG. 2A     FIG. 2B

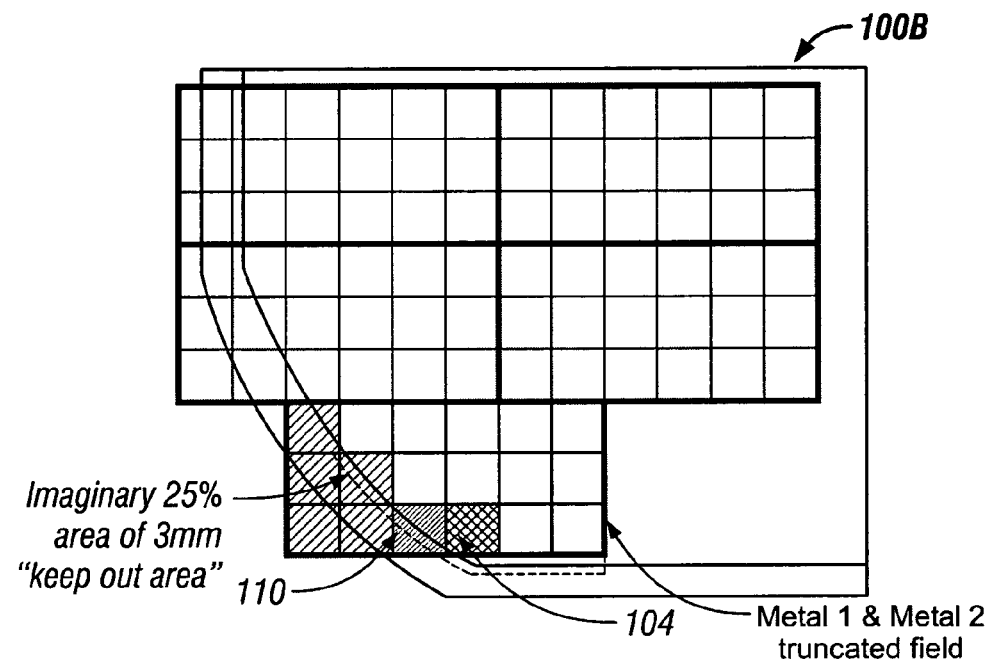
*FIG. 4*
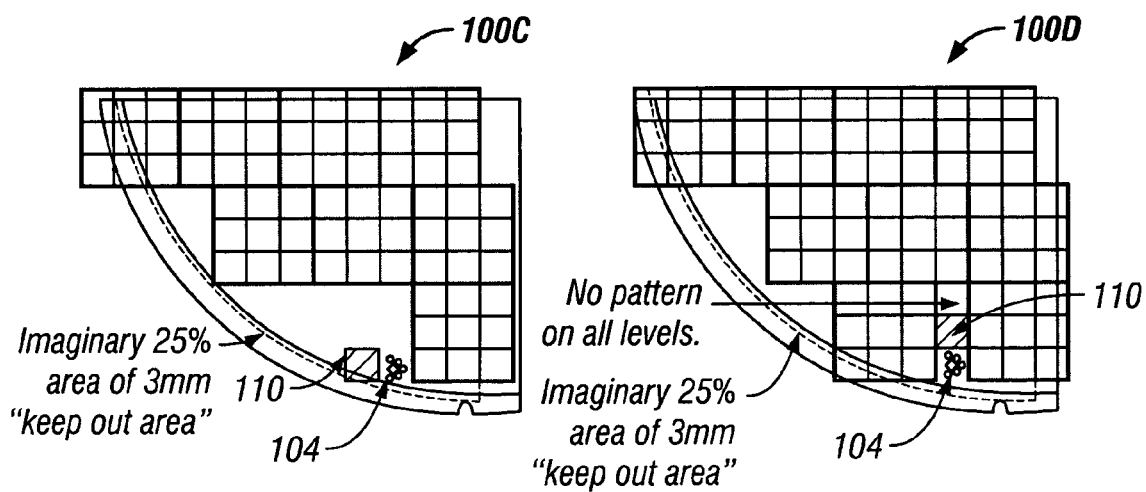
*FIG. 5*          *FIG. 6*

FIRST DIE INDICATOR FOR INTEGRATED CIRCUIT WAFER

TECHNICAL FIELD

The present invention is generally directed to an integrated circuit (IC) wafer and, more specifically, to a first die indicator for an IC wafer.

BACKGROUND OF THE INVENTION

Traditionally, all active die on an integrated circuit (IC) wafer have been electrically tested. Usually, when the die are tested, a wafer map is created that contains information on the X-Y coordinates of the wafer, referenced to a potentially good first die. The wafer map generally also stores bin information that indicates whether a given die is good or bad. The wafer map is then used at each subsequent wafer process step. Unfortunately, if a first wafer process step or any subsequent wafer process step utilizes the wrong first die, the wafer map is inaccurate, potentially resulting in bad die being classified as good die and good die being classified as bad die.

What is needed is a first die indicator for an integrated circuit wafer that allows first die integrity to be maintained throughout various wafer processing steps.

SUMMARY OF THE INVENTION

According to one embodiment of the present invention, an integrated circuit (IC) wafer includes a plurality of die and a first die indicator (FDI) formed on the wafer. The plurality of die include a first potentially good IC die and the FDI, which is detectable by a machine vision recognition system, provides a unique indication of the first potentially good die. The FDI may include a plurality of rings arranged in an arrowhead pattern. The rings may be formed in a metal layer, which may be IC interconnect metal and/or cap metal and/or solder metal. The FDI may further include a product name and a mask set name. Text of the product name and the mask set name may have a text height of at least about 100 microns, so as to be visually detectable by the machine vision recognition system. The FDI may be positioned along a flat side of the wafer at an end of the flat side. The FDI may further include an inker target that indicates ink dot placement for defective dies. In one embodiment, the inker target is diamond-shaped. The wafer may be of virtually any size.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a top view of an integrated circuit (IC) wafer that includes a plurality of die with a first die indicator (FDI) located on the wafer, adjacent to a first potentially good die;

FIGS. 2A-2B are top views of exemplary FDI designs;

FIG. 4 is a top view of a relevant portion of an IC wafer depicting an FDI placement and usage of field steps for a 1X UT stepper aligner;

FIGS. 5-6 are top views of a relevant portion of an IC wafer depicting an FDI placement and usage of field steps for a 4X UT stepper aligner for a package part and/or a package/bump part;

DESCRIPTION OF THE PREFERRED EMBODIMENTS

Figure 3:
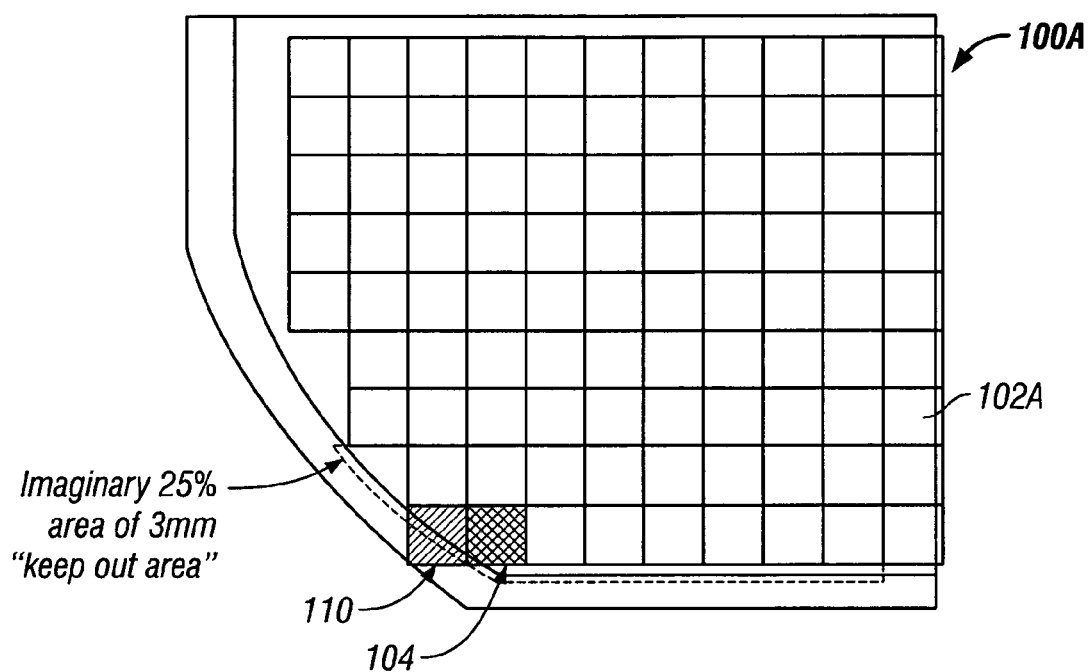
FIG. 3 is a top view of a relevant portion of an IC wafer that depicts an exemplary FDI placement for projection and proximity aligners.

According to the present invention, a first die indicator (FDI) is implemented on an integrated circuit (IC) wafer to facilitate the maintenance of first die integrity throughout various wafer process steps. According to the present invention, a design feature is placed on each of the wafers, which is visually detectable with an unaided human eye and/or a machine vision recognition system. The FDI provides an indication as to which die processing should begin with. According to the present invention, the die indicator can be utilized on a variety of different sized wafers, e.g., four inch, five inch, six inch and eight inch wafers, and may be implemented on bumped and non-bumped wafers.

In general, it is desirable for the FDI to be compatible with all photolithography processing equipment and all IC processes. According to the present invention, the FDI is a unique structure that is distinguishable by the human eye and/or machine vision recognition systems. In general, prior first die indicator designs have been inadequate, have not provided a solution for packaged stepper products and have been unreliable and inconsistent from part to part, due to size, color and contrast variations. According to the present invention, an FDI is placed on the IC wafer next to the first testable die location. The FDI feature allows a person to accurately setup a given machine vision recognition system to begin processing of the wafer at the correct location.

Various embodiments of the present invention are generally applicable to electrical tests, automatic visual inspection and sort of IC wafers. In one embodiment, the FDI consists of an arrowhead formed by circular patterns in the metal layers, i.e., IC interconnect metal, cap metal and solder metal levels, and may also include an inker target pattern. For jobs that require an identification (ID) number, text for a product name and mask set name may also be readily added to the FDI (see FIG. 2B) on metal levels other than cap metal and solder metal levels. In general, the text height should be approximately 200 µm high, with a width of approximately 33 µm. To allow readability, it is generally desirable that the text have at least 50 µm separation from all other data. In general, the text should not be smaller than about 100 µm high, to be useful. Text height constraints are set to provide more uniqueness to the FDI.

On a 1X UT packaged IC jobs, all metal levels typically receive an FDI and a truncated field. This, in general, ensures that the fields are visually unique from all other fields. Further, truncation of only one metal level, in general, is not desirable.

In various applications, it is also desirable to add an inker target that may be, for example, a 20-mil diamond placed on the interconnect metal levels and/or the cap metal level. The inker target is utilized to visually indicate where an operator should setup ink dot placements on defective die. In at least one embodiment, the inker target diamond is part of the standard FDI pattern. When the inker target is implemented, the placement of the FDI pattern is relative to the inker target. In general, the inker target is placed in the center of the die, with the exception of die that have internal solder metal in that area. When this occurs, it is desirable to move to a location away from the solder metal. The test area will designate a different location for the inker target, or a size and design of the inker target may be changed. It is generally desirable to place the inker targets away from internal solder metal, due to the fact that the solder metal bumps wick away the ink and, thus, a defective die may appear to be a good non-defective die.

In various applications, it may be desirable to short metal bond pads of the die that includes the FDI to distinguish, utilizing an electrical test, the FDI from surrounding dies. In general, the metal bond pad shorting pattern is not utilized on eight inch wafers, or bump only wafers with interconnect metal levels on stepper reticles. All bump wafers may include cap metal shorting bars around the perimeter of the FDI die. A cap metal test die is used to visually inspect the cap metal etch process during fabrication.

As is shown in FIG. 1, a wafer 100 includes an array of die locations 102 comprising a plurality of die 101 and a first die indicator (FDI) 104. A die 101 is formed at each die location 102 except the location of FDI 104. FDI 104 is located physically adjacent to the first potentially good die on the wafer 100. For most wafer arrays, the FDI 104 is positioned on the first whole die location in the lower left position of the wafer array. With reference to FIGS. 2A and 2B, exemplary FDI designs are shown. As is shown in FIG. 2A, FDI 104A utilizes five circles 103, which form an arrowhead, and includes an inker target diamond 105. With reference to FIG. 2B, an FDI 104B also includes identification (ID) text 107. FDI 104A or 104B is readily detectable by a machine vision recognition system 90.

FIG. 3 depicts a relevant portion of an IC wafer array 100A that provides an FDI placement for projection and proximity aligners. As is depicted, the FDI 104 may be partially located in the 3 mm keep out area by no more than about 25 percent or approximately about 750 µm. This allows the FDI 104 to remain inside the wafer array 100A an adequate amount, when a first level alignment error occurs.

Figure 7:
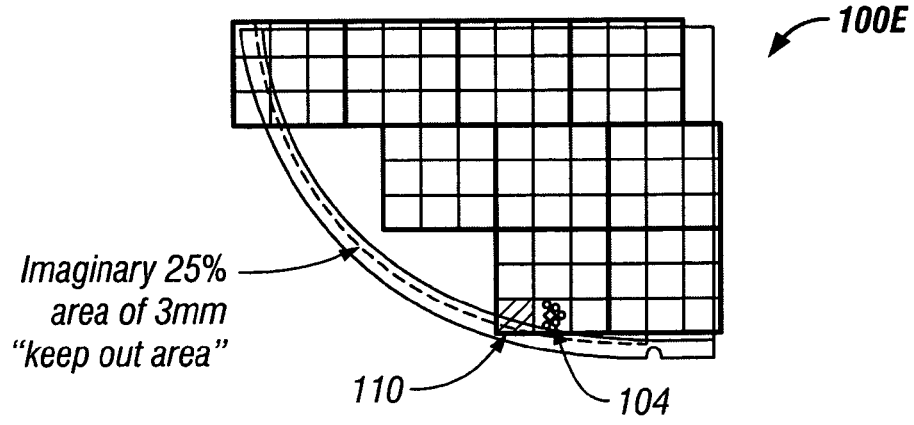
FIG. 7 is a top view of a relevant portion of an IC wafer depicting an exemplary FDI placement for a bump only part.

With reference to FIG. 4, an FDI placement for a 1X UT stepper aligner is depicted. The FDI 104 is placed on all interconnect metal levels and is positioned such that it is located in the 3 mm keep out area by no more than 25 percent or approximately 750 µm. This is desirable to keep the FDI 104 inside wafer array 100B an adequate amount, when a first level alignment error occurs. FIGS. 5 and 6 depict two set-up variations for an FDI placement on IC wafer arrays 100C and 100D for a 4X UT stepper aligner for a packaged IC or an IC set-up for package and bumping. As with the other designs, the FDI 104 can fall into the 3 mm keep out area by no more than 25 percent or approximately 750 µm, in order to maintain the FDI 104 inside the wafer arrays 100C and 100D by an adequate amount, when a first level alignment error occurs. FIG. 7 depicts a relevant portion of an IC wafer array 100E illustrating placement of the FDI 104 and cap test die 110 on a 4X UT stepper aligner for a metal bumped IC.

Figure 8:
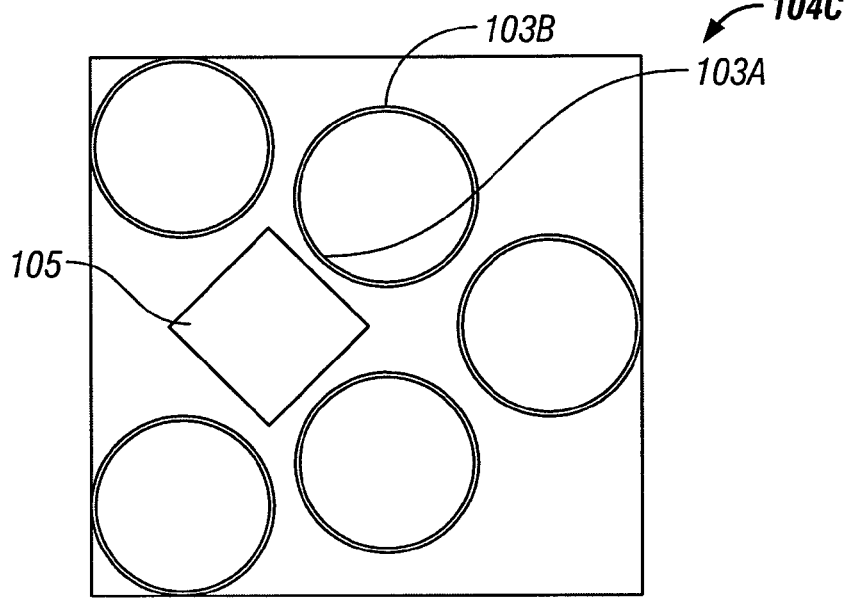
FIG. 8 is a top view of a multiple level portion of an exemplary FDI design having an overall size of approximately 1250 µm by 1250 µm.
Figure 9:
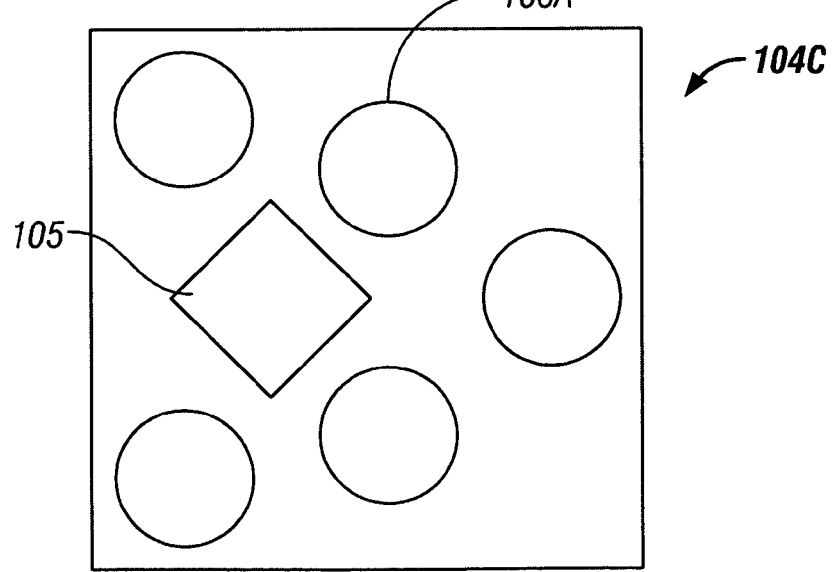
FIG. 9 is a top view of the FDI of FIG. 8 at an IC interconnect metal and/or cap metal level.
Figure 10:
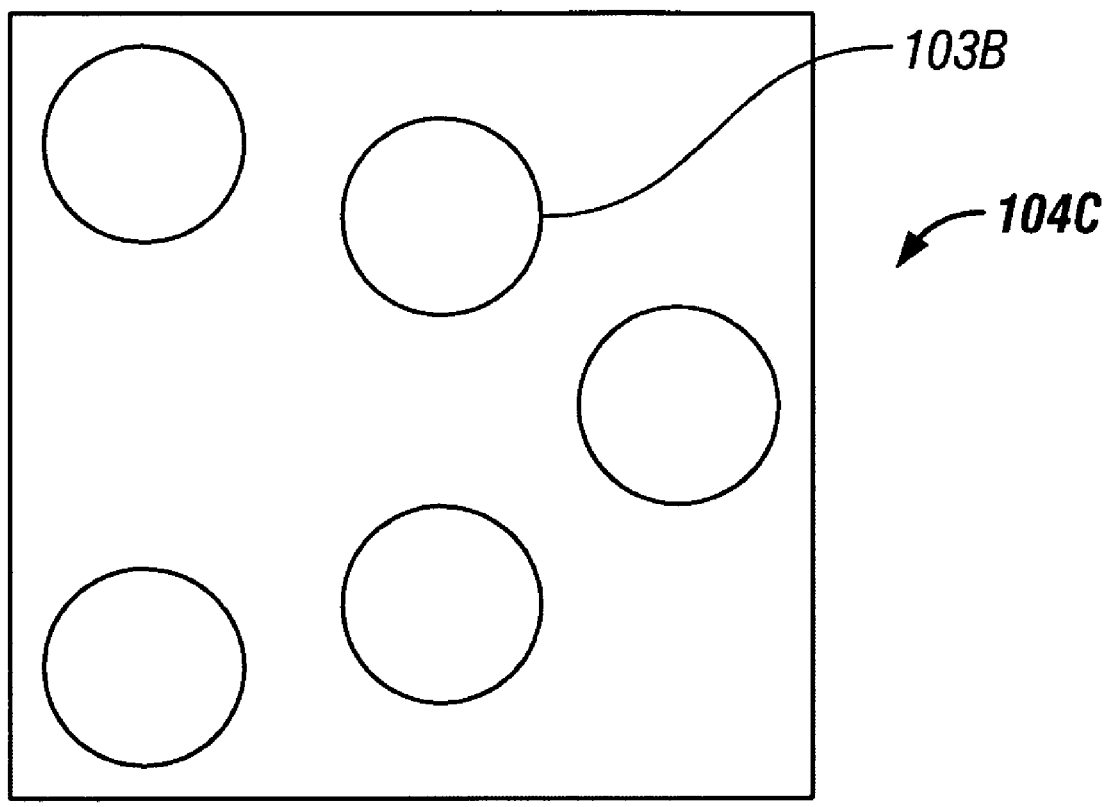
FIG. 10 is a top view of the FDI of FIG. 8 at a solder metal level.
Figure 11:
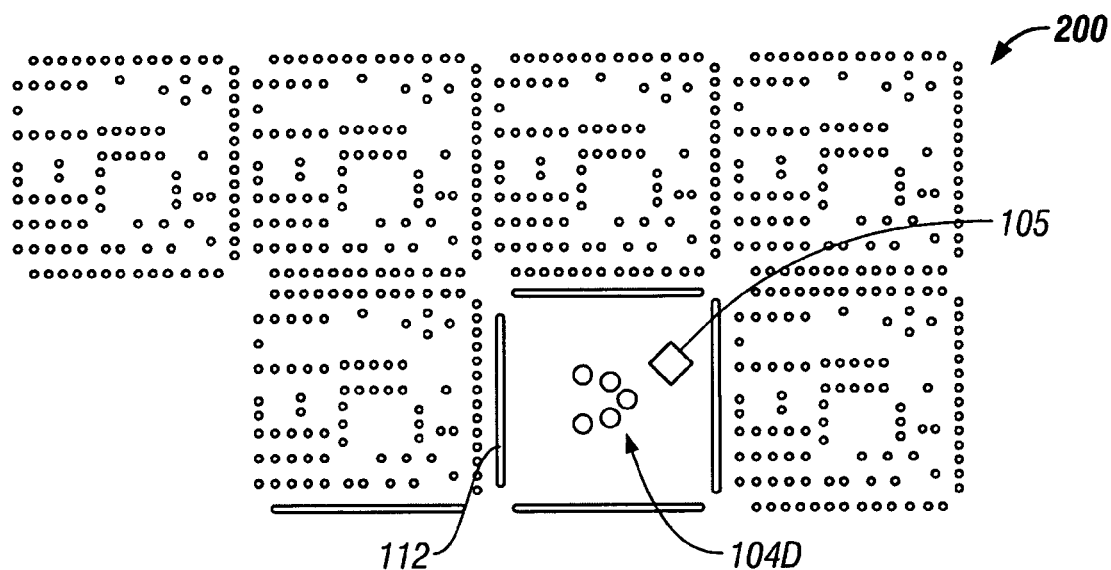
FIG. 11 depicts a relevant portion of an exemplary IC wafer that includes an FDI implemented at a cap metal level.
Figure 12:
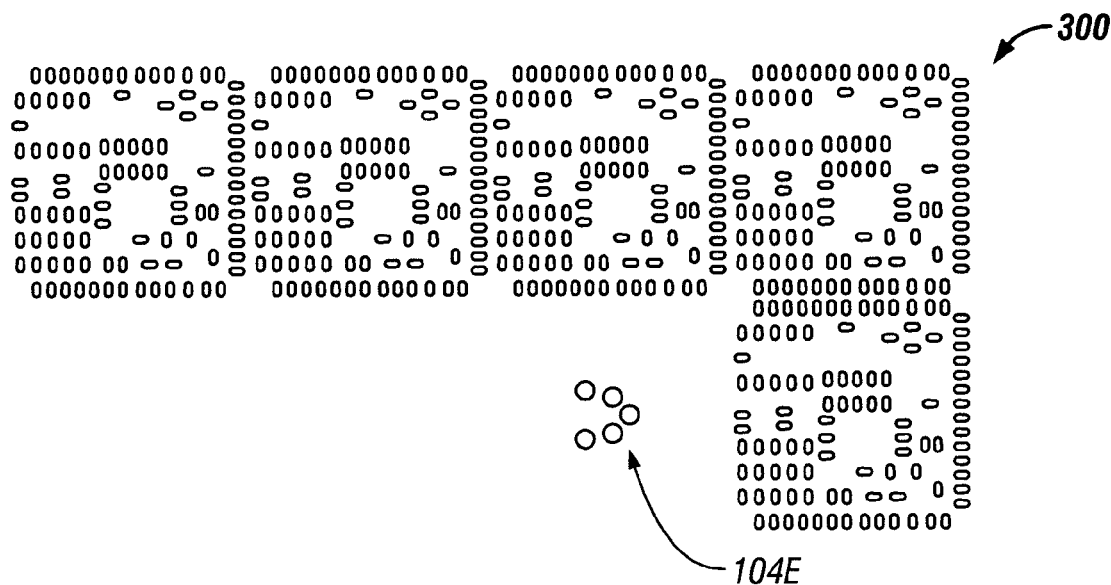
FIG. 12 depicts a relevant portion of an IC wafer that includes an FDI implemented at a solder metal level.

FIG. 8 depicts an exemplary FDI 104C having a size of approximately 1250 µm by 1250 µm. The FDI 104C includes circles 103A and 103B and an inker target 105 having a dimension of approximately 400 µm by 400 µm. FIG. 9 corresponds to a view of the FDI 104C of FIG. 8 at an interconnect metal or cap metal level and FIG. 10 depicts the FDI 104C of FIG. 8 at a solder metal level. When solder metal bumps are utilized to form the circles 103B, their outer diameter may be approximately 380 µm. When the FDI 104C is implemented in interconnect metal or cap metal, an inner diameter of the circles 103A of the FDI may be approximately 360 µm. FIG. 11 depicts a top view of a relevant portion of an exemplary IC wafer array 200 including an FDI 104D having an ink target 105 formed in a cap metal level. As is shown, the die with the FDI 104D also includes shorting bars 112. FIG. 12 depicts a relevant portion of an IC wafer array 300 including an FDI 104E formed in a solder metal level.

Accordingly, a number of first die indicator have been described herein that may be advantageously implemented on an integrated circuit wafer to maintain first die integrity throughout various wafer processing steps.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An integrated circuit (IC) wafer, comprising:
   an array comprising a first location and a series of die locations that includes a first testable die location adjacent the first location, each said die location comprising a testable die; and
   a first die indicator (FDI) formed at the first location in a die location that does not include a die and is adjacent to the first testable die, wherein the FDI is formed in one or more interconnect metal layers and wherein the FDI is detectable by a machine vision recognition system and is visually detectable by an unaided human eye.

2. The wafer of claim 1, wherein the FDI includes rings arranged in an arrowhead pattern pointing to the first testable die, and wherein the rings are formed in a metal layer.

3. The wafer of claim 2, wherein the FDI further includes a diamond-shaped inker target that indicates ink dot placement for defective die.

4. The wafer of claim 1, wherein the FDI further includes a product name and a mask set name.

5. The wafer of claim 4, wherein text of the product name and the mask set name have a text height of at least about 100 microns.

6. The wafer of claim 1, wherein the FDI further includes an inker target that indicates ink dot placement for defective die.

7. The wafer of claim 6, wherein the inker target is diamond-shaped.

8. The wafer of claim 1, wherein the wafer is one of a four inch wafer, a five inch wafer, a six inch wafer and an eight inch wafer.

9. The wafer of claim 1, wherein the wafer includes one of solder bumps and solder pads.

10. An integrated circuit (IC) wafer, comprising:
an array comprising a first location and a series of die locations that includes a first testable die location adjacent the first location, each said die location comprising a testable die; and
a first die indicator (FDI) formed at the first location in a die location that does not include a die and is adjacent to the first testable die, wherein the FDI is formed in a cap metal layer or a solder metal layer and wherein the FDI is detectable by a machine vision recognition system and is visually detectable by an unaided human eye.

11. An integrated circuit (IC) wafer, comprising:
an array comprising a first location and a series of die locations that includes a first testable die location adjacent the first location, each said die location comprising a testable die; and
a first die indicator (FDI) formed at the first location, wherein the FDI is detectable by a machine vision recognition system and includes a diamond-shaped inker target that indicates ink dot placement for defective die, said FDI being formed in a metal layer, wherein the metal layer is a cap metal layer.

12. The wafer of claim 11, wherein the FDI is visually detectable by an unaided human eye.

13. The wafer of claim 11, wherein the wafer includes one of solder bumps and solder pads.

14. An integrated circuit (IC) wafer, comprising:
an array comprising a first location and a series of die locations that includes a first testable die location adjacent the first location, each said die location comprising a testable die; and
a first die indicator (FDI) formed at the first location, wherein the FDI is detectable by a machine vision recognition system and includes a diamond-shaped inker target that indicates ink dot placement for defective die, said FDI being formed in a metal layer, wherein the metal layer includes one or more interconnect metal layers.

* * * * *